United States Patent
Doi et al.

[11] Patent Number: 5,883,913
[45] Date of Patent: *Mar. 16, 1999

[54] OPTICAL DEVICE

[75] Inventors: Masato Doi; Hironobu Narui; Kenji Sahara; Osamu Matsuda, all of Kanagawa, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 513,760
[22] PCT Filed: Dec. 27, 1993
[86] PCT No.: PCT/JP94/02178
  § 371 Date: Mar. 25, 1996
  § 102(e) Date: Mar. 25, 1996
[87] PCT Pub. No.: WO95/18444
  PCT Pub. Date: Jul. 6, 1995

[30] Foreign Application Priority Data

Dec. 27, 1993 [JP] Japan .................................. 5-333574

[51] Int. Cl.$^6$ .......................................................... H01S 3/18
[52] U.S. Cl. .................................. 372/50; 257/80; 257/82; 257/84; 257/88
[58] Field of Search .................................. 372/50; 257/80, 257/82, 84, 88, 96

[56] References Cited

U.S. PATENT DOCUMENTS

| | | | |
|---|---|---|---|
| 4,873,429 | 10/1989 | Kume et al. | 257/82 |
| 5,105,239 | 4/1992 | Uchino et al. | 257/82 |
| 5,349,210 | 9/1994 | Ackley et al. | 372/50 |

FOREIGN PATENT DOCUMENTS

| | | | |
|---|---|---|---|
| 1-27289 | 1/1989 | Japan | 372/43 |
| 64-46243 | 2/1989 | Japan . | |
| 1-303638 | 12/1989 | Japan | 372/50 |
| 2-278779 | 11/1990 | Japan | 372/50 |
| 4-207079 | 7/1992 | Japan . | |

*Primary Examiner*—Rodney Bovernick
*Assistant Examiner*—Yisun Song
*Attorney, Agent, or Firm*—Hill & Simpson

[57] ABSTRACT

An optical device has an optical element 21 comprising a light-emitting region 1 and a light-detecting region 4 disposed closely to each other on a common substrate 9. Returning light $L_R$ from an irradiated medium which is irradiated with light L emitted by the light-emitting region 1 is detected by the light-detecting region 4. The returning light is applied to a light-detecting region 4 at an incident angle $\alpha$ in the range of $0° < \alpha < 90°$.

4 Claims, 13 Drawing Sheets

5,883,913

OPTICAL DEVICE

TECHNICAL FIELD

The present invention relates to an optical device for applying light from a light-emitting unit to an irradiated medium such as an optical disk, a magnetooptical disk, or the like and detecting returning light reflected by the irradiated medium.

BACKGROUND ART

Conventional optical devices, e.g., optical pickups in compact disc (CD) players or optical disk drives or magnetooptical disk drives, are complex in their overall arrangement, require complicated optical layout settings, and cannot easily be mass-produced because optical components including gratings, beam splitters, etc. are individually assembled.

For example, an optical pick for use with an optical recording medium such as an optical disk, for example, which is shown in FIG. 15 of the accompanying drawings, has a light source 51 such as a semiconductor laser diode or the like for emitting a light beam. The light beam emitted by the light source 51 is introduced through a grating 52 into a beam splitter 53 and passes therethrough. The light beam travels through a collimator lens 54 and is focused by an objective 55 onto a recorded area of an optical recording medium 56 such as an optical disk. In FIG. 15, the dot-and-dash line "c" represents an optical axis from the light source 51 to the optical recording medium 56.

The light beam reflected by the optical recording medium 56 passes through the objective 55 and the collimator lens 54, and is reflected by the beam splitter 53 off the optical axis "c" to travel through a concave lens 57 and a cylindrical lens 58, which focus the light beam onto a detector 59 such as a photodiode (PD) or the like.

Another optical device, which is shown as part of the optical pickup of a reflective optical scanning microscope in FIG. 16 of the accompanying drawings, has a light source 51 which emits a light beam that is reflected by a beam splitter 53. The reflected light beam is focused by an objective 55 onto the surface of a specimen 60 over a focal plane 61. The light beam reflected by the specimen 60 travels through the objective 55 and the beam splitter 53, and either is detected by a detector positioned in a confocal point or passes through a pinhole 62 and is then detected by a detector 59 disposed behind the pinhole 62. The condition of the surface of the specimen 60 can be detected when a stage that supports the specimen 60 or the irradiating light beam is relatively scanned as indicated by the arrow "s".

In the above conventional optical devices as optical pickups, in order to prevent the reflected light beam from returning to the position where it is emitted, i.e., the light source, the beam splitter is disposed between the light source and the irradiated medium or a hologram is disposed as disclosed in Japanese laid-open patent publication No. 1-303638 for separating the reflected light beam, i.e., the light beam returned to the light source, from the optical path toward the irradiated medium. With this arrangement, however, the intensity of light that is detected by the light-detecting device is reduced.

If any of the above optical devices is assembled as a hybrid structure on a semiconductor substrate such as of Si or the like as shown in Japanese laid-open patent publication No. 2-278779, then a strict level of accuracy for alignment will be required.

The present invention has been made to simplify the structure and reduce the overall size of an optical device such as an optical pickup, for example, to simplify the process of manufacturing the optical device, to increase the reliability of the optical device, and to increase the intensity of returning light toward a light-detecting device, i.e., the intensity of detected light, so that the optical device will produce an increased output, have a light source of low power requirement, and consume a reduced amount of electric energy.

DISCLOSURE OF THE INVENTION

According to the present invention, an optical device comprises an optical element having a light-emitting region for emitting light and a light-detecting region for detecting returning light from an irradiated medium which is irradiated with the light emitted by the light-emitting region, the light-emitting region and the light-detecting region being disposed closely to each other on a common substrate, the arrangement being such that the returning light is applied to a light-detecting surface of the light-detecting region at an incident angle $\alpha$ in the range of $0°<\alpha<90°$.

According to the present invention, an optical device comprises an optical element having a light-emitting region for emitting light and a light-detecting region for detecting returning light from an irradiated medium which is irradiated with the light emitted by the light-emitting region, the light-emitting region and the light-detecting region being disposed closely to each other on a common substrate, and converging means for converging and applying the light emitted by the light-emitting region of the optical element to the irradiated medium, and converging the returning light from the irradiated medium, the light-detecting region being disposed in the vicinity of a confocal point of the converging means with respect to the returning light reflected by the irradiated medium, the arrangement being such that the returning light is applied to a light-detecting surface of the light-detecting region at an incident angle $\alpha$ in the range of $0°<\alpha<90°$.

According to the present invention, an optical device comprises at least first, second, and third optical elements disposed on a common substrate and each having a light-emitting region and a light-detecting region, the first and third optical elements being substantially symmetrically positioned one on each side of the second optical element, and converging means for converging and applying light emitted by the light-emitting regions of the first, second, and third optical elements and traveling through different optical paths, to an irradiated medium, and converging returning light from the irradiated medium, the light-detecting region of each of the first, second, and third optical elements being disposed in the vicinity of a confocal point of the converging means with respect to the returning light reflected by the irradiated medium, the arrangement being such that the returning light is applied to a light-detecting surface of each of the light-detecting regions at an incident angle $\alpha$ in the range of $0°<\alpha<90°$.

The light-detecting region is disposed above a reflecting mirror disposed in confronting relationship to at least an end surface of the resonator of a semiconductor laser.

The reflecting mirror has a reflecting mirror composed of a {111} crystal face.

The semiconductor laser is disposed on a semiconductor substrate which has a principal surface composed of a {100} face.

Figure 13:
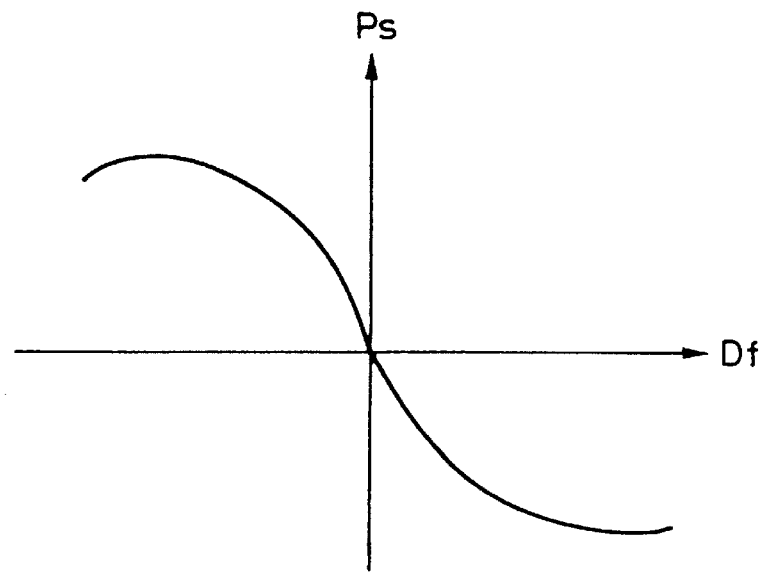
Figure 14:
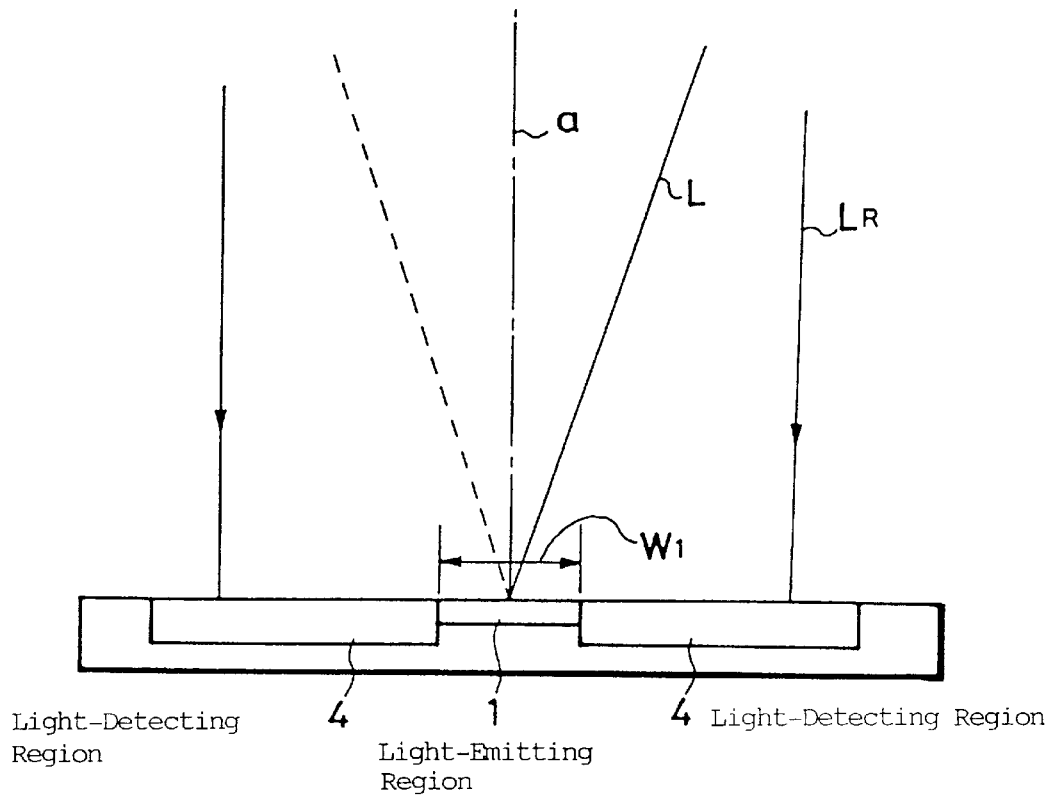
Figure 15:
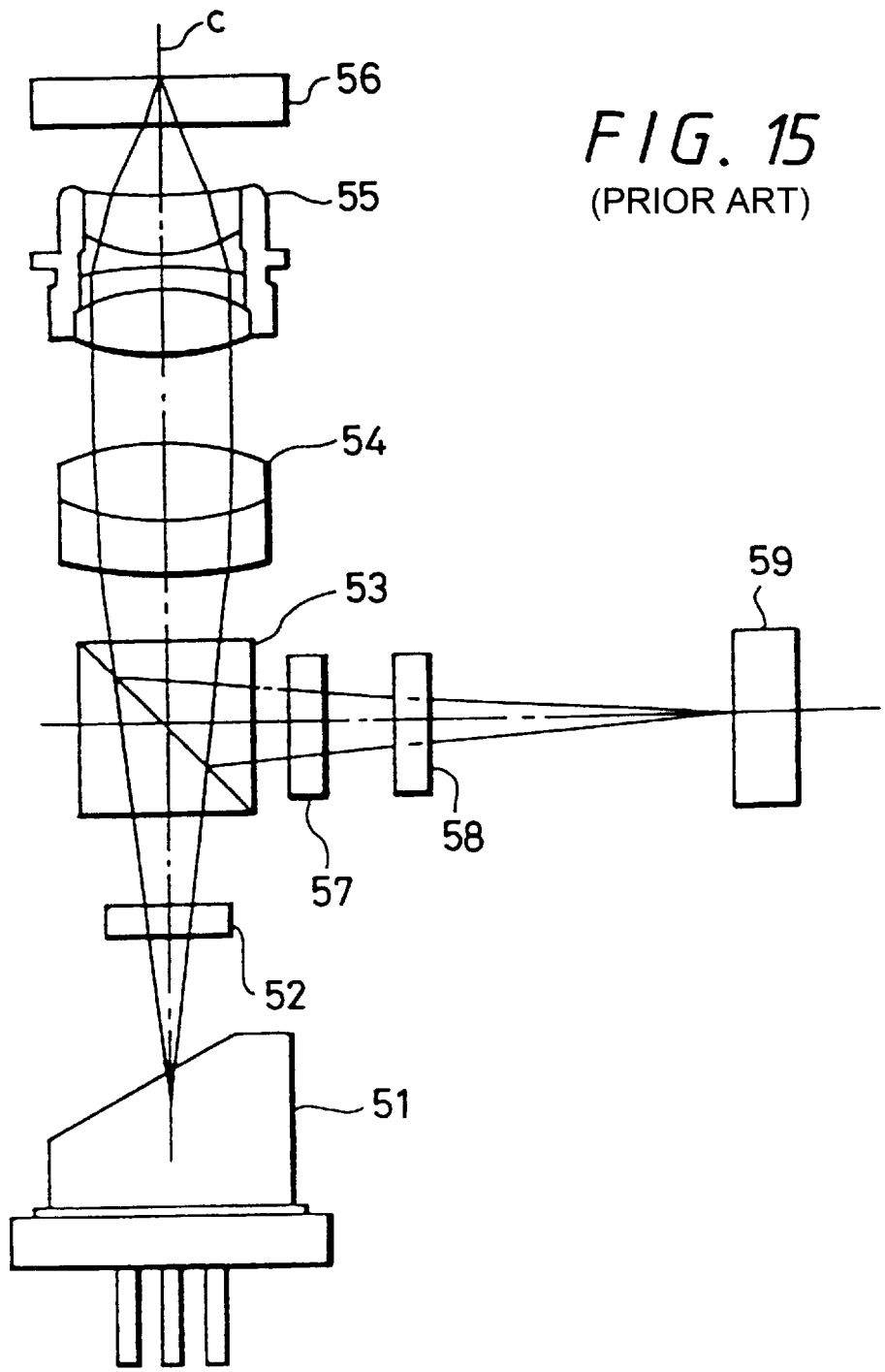

FIGS. $12A_1 \sim 12A_3$, $12B_1 \sim 12B_3$, and $12C_1 \sim 12C_3$ are diagrams illustrative of a focusing servo process carried out by an optical device according to the present invention, FIGS. $12A_2$ and FIGS. $12A_1$ and $12A_3$ schematically showing the relationship between the spots of returning light, the effective insensitive zones of light-emitting regions, and the effective light-detecting zones of light-detecting regions of a central optical device and two optical devices disposed one on each side of the central optical device when the light is focused on an irradiated surface with respect to the central optical device, FIGS. $12B_2$ and FIGS. $12B_1$ and $12B_3$ schematically showing the relationship between the spots of returning light, the effective insensitive zones of light-emitting regions, and the effective light-detecting zones of light-detecting regions of a central optical device and two optical devices disposed one on each side of the central optical device when the light is underfocused on an irradiated surface with respect to the central optical device, and FIGS. $12C_2$ and FIGS. $12C_1$ and $12C_3$ schematically showing the relationship between the spots of returning light, the effective insensitive zones of light-emitting regions, and the effective light-detecting zones of light-detecting regions of a central optical device and two optical devices disposed one on each side of the central optical device when the light is overfocused on an irradiated surface with respect to the central optical device;

FIG. 13 is a diagram showing the relationship between a focusing servo output Ps and a focused position Df in an optical device according to the present invention;

FIG. 14 is a schematic view of a comparative optical device that is used in the explanation of the present invention;

FIG. 15 is a schematic view of a conventional optical device; and

Figure 16:
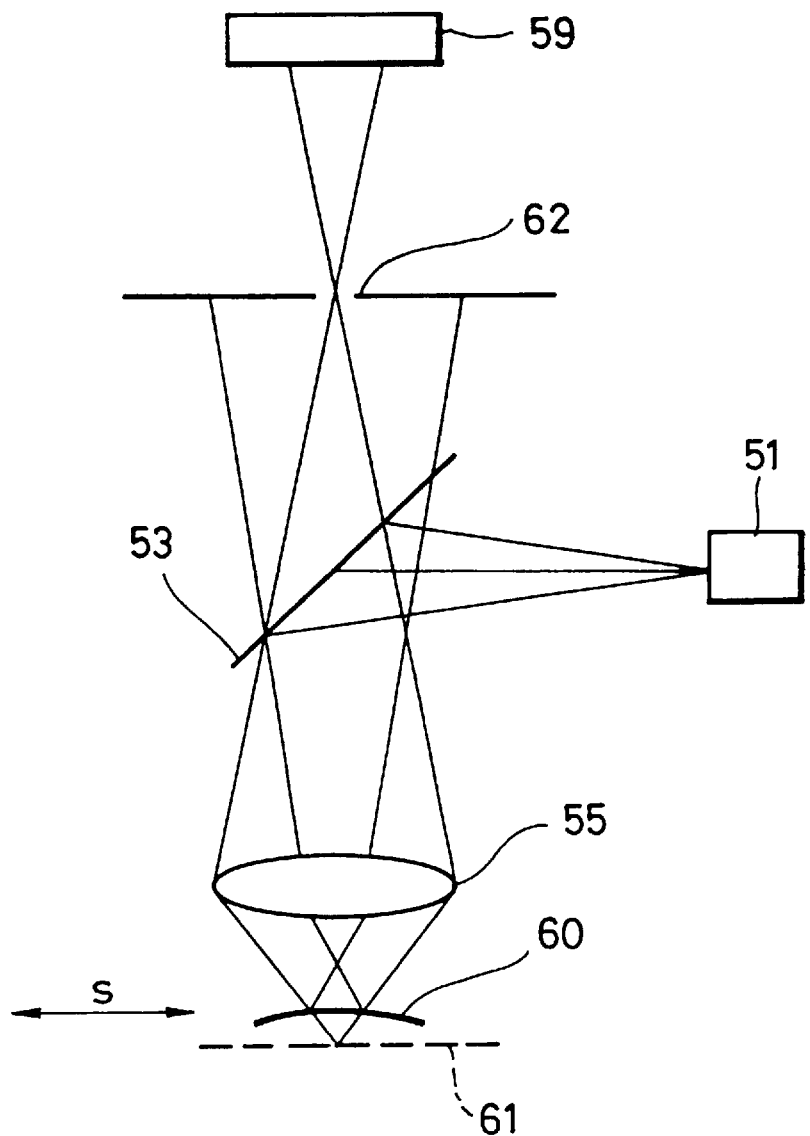

FIG. 16 is a schematic view of another conventional optical device.

BEST MODE FOR CARRYING OUT THE INVENTION

The present invention will now be described in detail with reference to the drawings.

Figure 1:
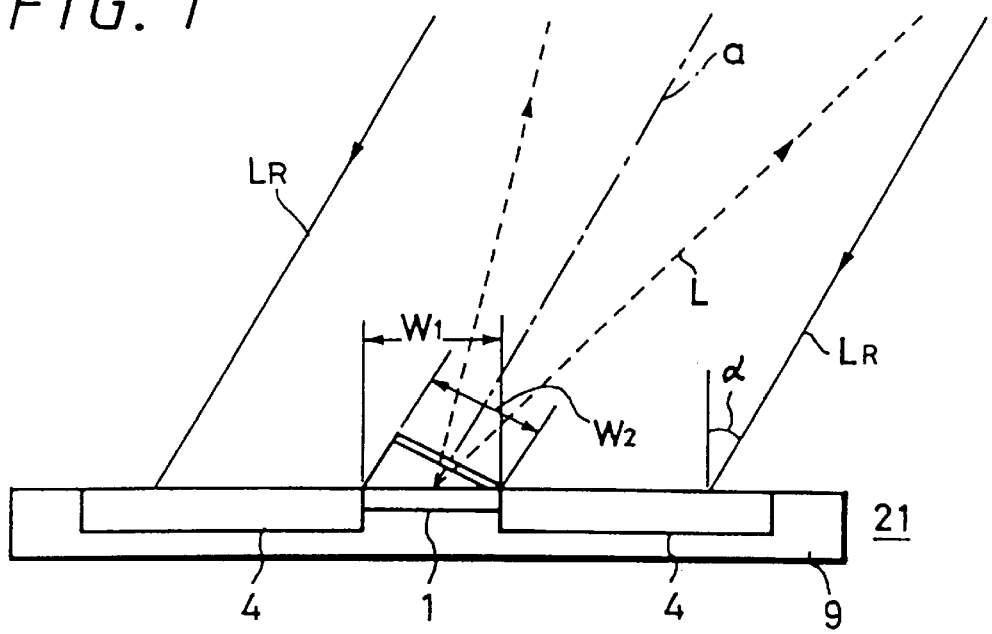
FIG. 1 is a schematic view of an optical element of an optical device according to the present invention.

According to the present invention, as schematically shown in FIG. 1, an optical device has an optical element 21 comprising a light-emitting region 1 and light-detecting regions 4 which are disposed closely on a common substrate 9, the light-detecting regions 4 serving to detect returning light $L_R$ from an irradiated medium (not shown) which is irradiated with light L emitted from the light-emitting region 1. The returning light $L_R$ is applied to the photo-detecting surfaces of the light-detecting regions 4 at an incident angle $\alpha$ in the range of $0° < \alpha < 90°$.

Figure 2:
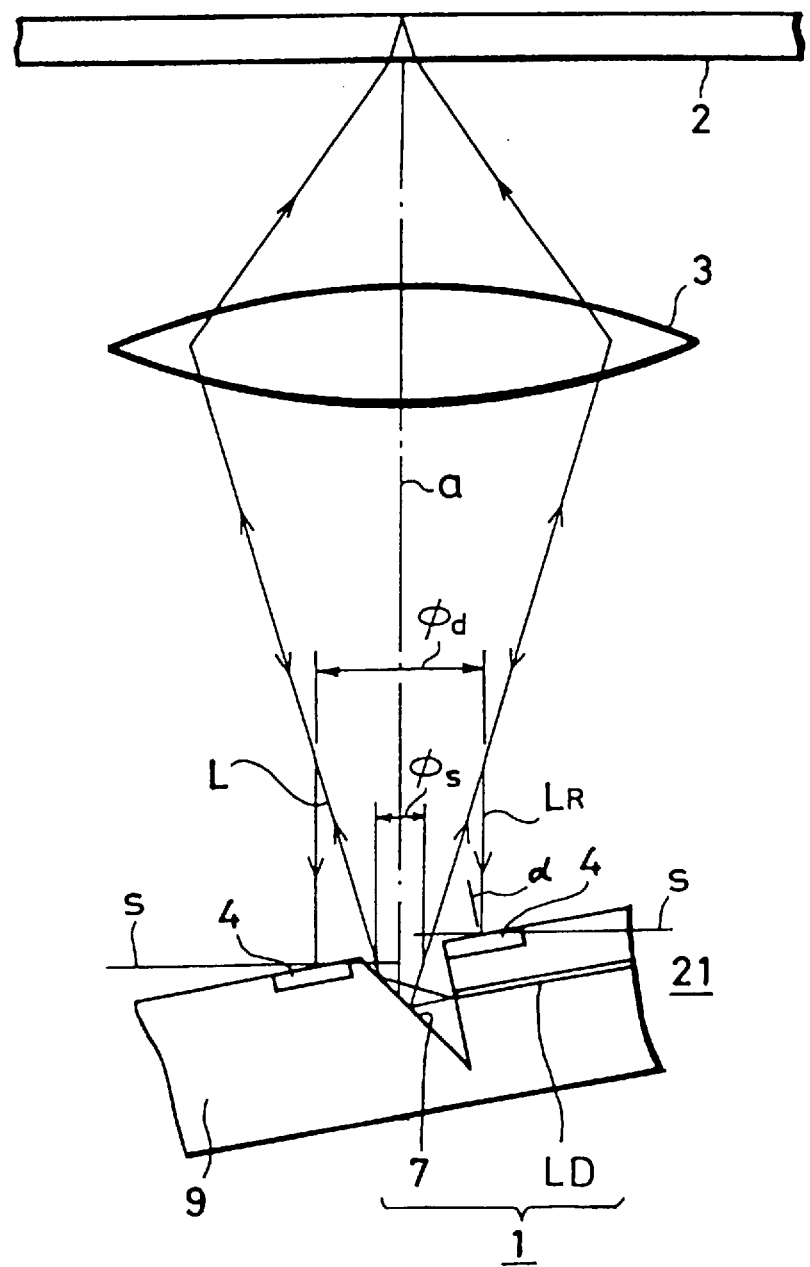
FIG. 2 is a schematic view of an optical device according to the present invention.

As schematically shown in FIG. 2, another optical device according to the present invention has an optical element 21 comprising a light-emitting region 1 and light-detecting regions 4 which are disposed closely on a common substrate 9, the light-detecting regions 4 serving to detect returning light $L_R$ from an irradiated medium 2 which is irradiated with light L emitted from the light-emitting region 1, and a converging means 3 for converging the light L emitted from the light-emitting region 1 onto the irradiated medium 2 and also converging the returning light reflected by the irradiated medium 2. The light-detecting regions 4 are disposed in the vicinity of a confocal point of the converging means 3 with respect to the returning light $L_R$ reflected by the irradiated medium 2. The returning light $L_R$ is applied to the photo-detecting surfaces of the light-detecting regions 4 at an incident angle $\alpha$in the range of $0° < \alpha < 90°$.

Figure 3:
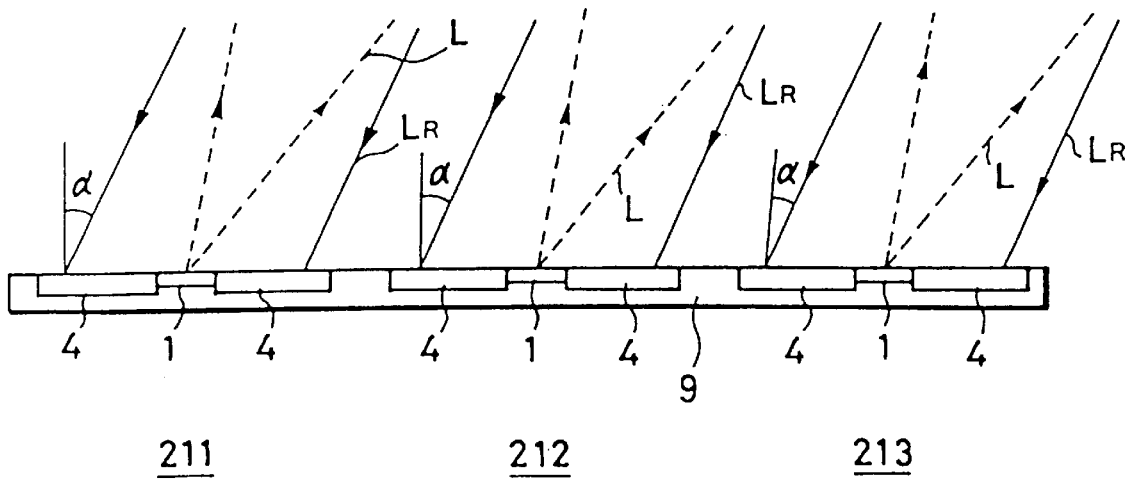
FIG. 3 is a schematic view of another optical element of an optical device according to the present invention.

Still another optical device according to the present invention, as schematically shown in FIG. 3, includes at least three optical elements 211, 212, 213 instead of the single optical element 21 shown in FIG. 1. Specifically, the optical device comprises first, second, and third optical elements 211, 212, 213 disposed on a common substrate 9 and each having a light-emitting region 1 and light-detecting regions 4 which are positioned closely to each other, and a converging means 3. As shown in FIG. 3, the first and third optical elements 211, 213 are substantially symmetrically positioned one on each side of the second optical element 212.

Emitted light L from the light-emitting regions 1 of the optical elements 211, 212, 213 and returning light $L_R$ travel along different optical paths. The emitted light L from the light-emitting regions 1 of the optical elements 211, 212, 213 is converged and applied to the irradiated medium 2 by the converging means 3 in the same manner as described with reference to FIG. 2, and the returning light reflected by the irradiated medium 2 is converged by the converging means 3. The light-detecting regions of the optical elements 211, 212, 213 are disposed in the vicinity of a confocal point of the converging means 3 with respect to the returning light $L_R$ reflected by the irradiated medium 2, i.e., in the vicinity of a confocal point with the light-emitting regions 1. The returning light $L_R$ is applied to the photo-detecting surfaces of the light-detecting regions 4 at an incident angle $\alpha$ in the range of $0°<\alpha<90°$.

Embodiments of optical devices according to the present invention will be described in detail with reference to the drawings.

FIG. 2 schematically shows the arrangement of an optical pickup in which the irradiated medium 2 comprises an optical recording medium, e.g., an optical disk having information recorded as pits. The optical pickup reproduces the recorded information based on the intensity of reflected light from the optical disk which is varied by the diffraction of the light that is caused by the pits when reading light is applied to the optical disk.

The optical pickup includes a light-emitting region 1, an irradiated medium 2 in the form of an optical disk, a converging means 3, and light-detecting regions 4. Light emitted from the light-emitting region 1 is converged and applied to the irradiated medium 2 by the converging means 3, and returning light reflected by the irradiated medium 2 is converged by the converging means 3. The light-detecting regions 4 are positioned in the vicinity of a confocal point of the converging means 3 with respect to the returning light from the irradiated medium 2. Before and after the emitted light from the light-emitting region 1 is reflected by the irradiated medium 2, the light travels along an optical path having the same optical axis indicated by the chain line "a", and is detected by the light-detecting regions 4.

The light-emitting region 1 and the light-detecting regions 4 are integrally formed on a common substrate 9 in an optical integrated arrangement.

Figure 4:
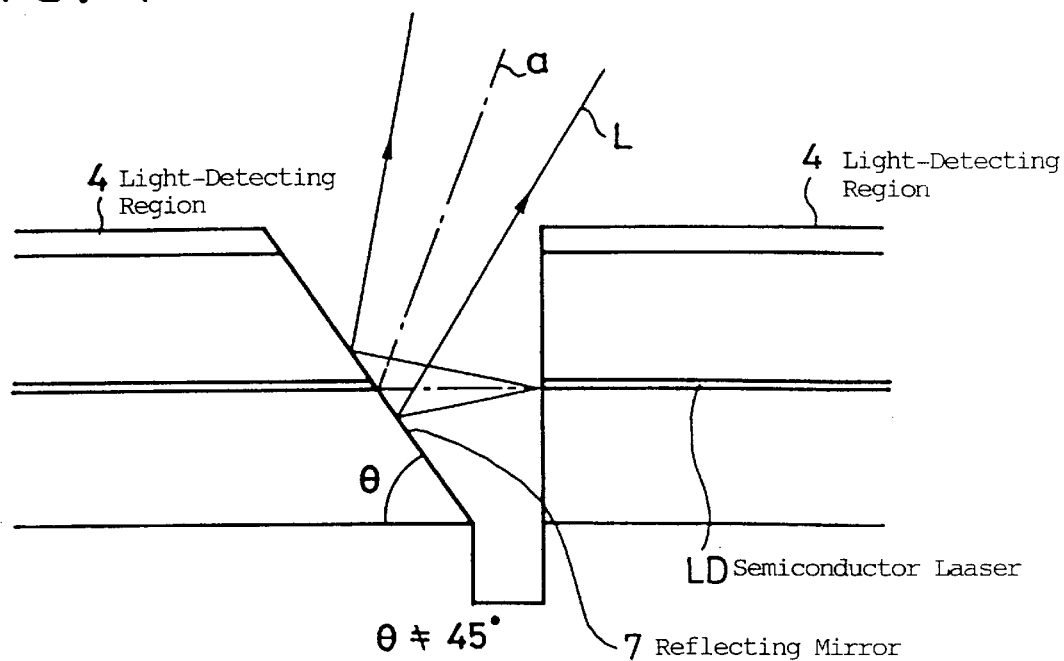
FIG. 4 is a schematic cross-sectional view an optical element of an optical device according to the present invention.

As shown in FIG. 4, the light-emitting region 1 has a semiconductor laser LD having a horizontal resonator and a reflecting mirror 7, and each of the light-detecting regions 4 comprises a photodiode. The semiconductor laser LD, which has a horizontal resonator, emits light L that is reflected by the reflecting mirror 7 and applied to the irradiated surface of the irradiated medium 2 at a given incident angle. As shown in FIG. 1, the incident angle $\alpha$ ($0°<\alpha<90°$) at which the returning light R reflected by the irradiated medium 2 is applied to the light-detecting surfaces of the light-detecting regions 4 should preferably be such that the emitted light or the returning light will not be vignetted by the semiconductor laser or the reflecting mirror. In FIG. 4, if $\theta$ is 54.7°, then $\alpha$ is 19.4°.

The light detected by the light-detecting regions 4 is converged nearly to a light diffraction limit. At least a portion of the light-detecting surfaces of the light-detecting regions 4 is positioned within the light diffraction limit, i.e., as shown in FIG. 2, the distance thereof from the optical axis "a" of the light emitted from the light-emitting region 1 transversely to positioning reference planes S of the light-detecting surfaces is equal to 1.22λ/NA or less where λ is the wavelength of the light emitted from the light-emitting region 1 and NA is the numerical aperture of the converging means 3.

As shown in FIG. 2, the light emitted from the light-emitting region 1 has a diameter $\phi$s at the positioning reference planes S of the light-detecting surfaces of the light-emitting regions 4, the diameter $\phi$s being smaller than the diameter $\phi$d of the light at the light diffraction limit, and the effective light-detecting surfaces of the light-emitting regions 4 are positioned outside of the diameter $\phi$s. If a semiconductor laser is used as the light source of the light-emitting region 1, then the diameter $\phi$s of the emitted light ranges from about 1 to 2 $\mu$m. If the numerical aperture NA of the converging means 3 is in the range of from 0.09 to 0.1, for example, and the wavelength λ of the emitted light is about 780 nm, then the light diffraction limit, i.e., the diameter $\phi$d, is 1.22λ/NA ≈10 $\mu$m.

The light-emitting region 1 is positioned in one confocal point of the converging means 3. Specifically, the waist of the light emitted from the semiconductor laser is positioned at the confocal point. The irradiated medium 2 is positioned in the other focal point of the converging means 3.

The light emitted from the light-emitting region 1 is applied through the converging means 3, i.e., an optical condensing lens, to the optical disk of the irradiated medium that is positioned in its confocal point. The light reflected by the optical disk, i.e., the returning light which contains the recorded information, is converged by the converging means 3 and applied to the photodiodes of the light-detecting regions 4 disposed in the vicinity of the confocal point. The light-detecting regions 4 detect the returning light, i.e., converts the returning light into an electric signal which is picked up as a reproduced signal.

If the light-detecting surfaces of the photodiodes of the light-detecting regions 4 are spaced from the optical axis "a" by a distance which is greater than $\phi$s/2 but equal to or smaller than $\phi$d/2, then the light-detecting regions 4 are capable of detecting the returning light from the irradiated medium 2, i.e., the optical disk, reliably separately from the emitted light.

Figure 5:
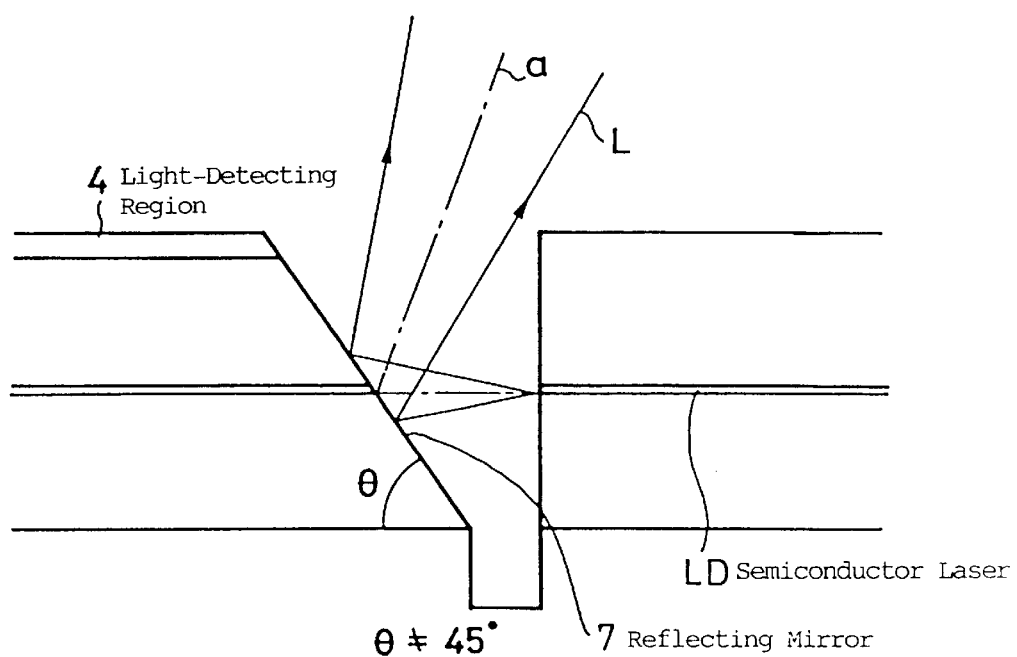
FIG. 5 is a schematic cross-sectional view of another optical element of an optical device according to the present invention.

While the light-detecting regions 4 are positioned respectively above the reflecting mirror 7 and the semiconductor laser in FIGS. 2 and 4, only one light-detecting region 4 may be positioned above the reflecting mirror 7 as shown in FIG. 5. In FIG. 2, the irradiated medium 2 is described as an optical disk. However, the optical device according to the present invention is not limited to the above arrangement, but may comprise an optical pickup for reading a signal magnetically recorded on a magnetooptical disk based on the Kerr effect. In such a modified arrangement, though not shown, a polarizer is disposed between the light-emitting region 1 and the irradiated medium 2, i.e., in an optical path of the emitted light from the light-emitting region 1 toward the irradiated medium 2 and an optical path of the returning light from the irradiated medium 2, and an analyzer is disposed in a position over the light-detecting regions 4 out of the optical path of the emitted light from the light-emitting region 1 in confronting relation to the polarizer.

In the modified arrangement, light applied to the magnetooptical disk of the irradiated medium 2 is reflected thereby as returning light whose plane of polarization has been rotated by the Kerr effect depending on the recorded information. The intensity of light that passes through the analyzing means varies depending on the Kerr angle of rotation. When the variation of the intensity light is detected by the light-detecting regions 4, the information recorded on the magnetooptical disk is reproduced.

The converging means 3 may comprise a collimator lens or any of various other components.

As described above, because the light-emitting region 1 and the light-detecting regions 4 are integrally disposed on the common substrate 9, they are easily and reliably positioned in a necessary and sufficient predetermined positional relationship to each other.

An optical element 21 according to the present invention in which a light-emitting region 1 and light-detecting regions 4 are integrally disposed on a common substrate in a monolithic structure will be described below with reference to FIG. 6.

First and second mesas 111, 112 are formed on a compound semiconductor substrate 9 as of GaAs, InP, or the like with a {100} crystal face as a principal surface, one on each side of a groove 102 that is defined in the compound semiconductor substrate 9 along a [01-1] crystal axis. At least one side 102a of the groove 102 adjacent to the first mesa 111 is shaped in an inverted-mesa configuration, and an epitaxial semiconductor layer 103 is formed on the first and second mesas 111, 112, resulting in a semiconductor laser LD on the first mesa 111. A reflecting mirror 7 composed of a certain crystal face is formed on the second mesa 112 along a side edge adjacent to the groove 102 in a confronting relationship to a light-emitting end surface of the semiconductor laser LD.

A light-detecting region 4, e.g., a photodiode PD, is disposed on at least one of the first and second mesas 111, 112.

The epitaxial semiconductor layer 103 on the first mesa 111 has an end surface $108a_2$ extending along a side edge thereof adjacent to the groove 102 and composed of a {110} crystal face. The epitaxial semiconductor layer 103 on the second mesa 112 has an end surface extending along a side edge thereof adjacent to the groove 102 and including either an end surface $108b_1$ composed of a {111}A crystal face and an end surface $108b_2$ composed of a {110} crystal face or only an end surface $108b_1$ composed of a {111}A crystal face.

The first and second mesas 111, 112 have respective heights different from each other, i.e., have flat surfaces different from each other, for allowing the light emitted from the semiconductor laser LD to be applied reliably to the reflecting mirror 7 and reflected thereby in a given direction.

A process of manufacturing the optical element 21 will be described below with reference to FIGS. 7A and 7B.

Figure 7A:
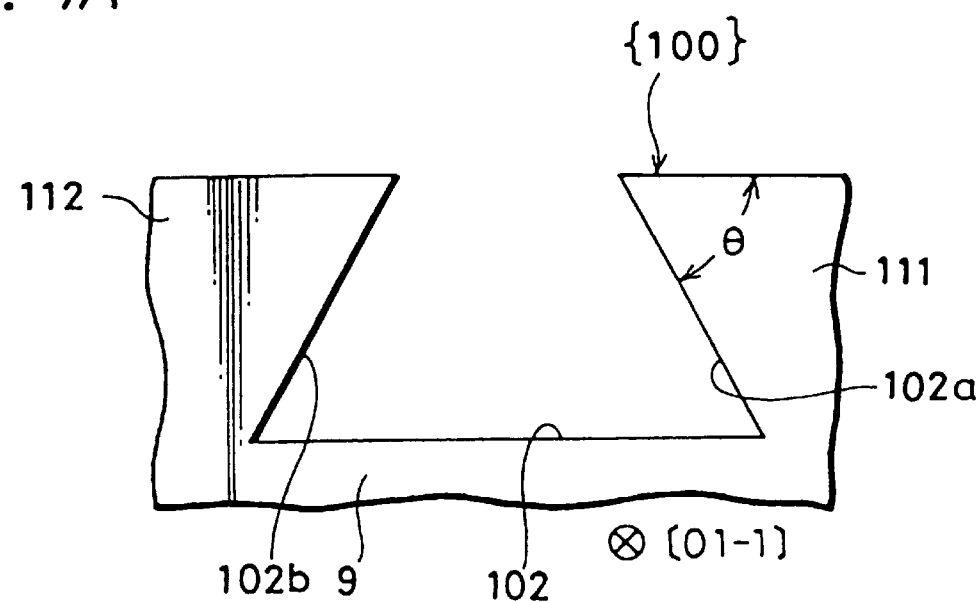
FIG. 7A is a view illustrative of a step of a process of fabricating an optical element according to the present invention.

As shown in FIG. 7A, a compound semiconductor substrate 9 of GaAs or InP having a principal surface composed of a {100} crystal face and a first conductivity type such as an "n" type, for example, is prepared, and a groove 102 is defined in the principal surface in the direction of a [01-1] crystal axis. First and second mesas 111, 112 are formed one on each side of the groove 102.

The direction [01-1] is generally referred to as a forward mesa direction. Inner surfaces 102a, 102b along the direction [01-1] are formed as slanted surfaces so inclined as to underlie the mesas 111, 112 progressively in an inverted-mesa configuration, i.e., in the direction of the depth of the groove 102, by selecting an etching solution, e.g., an etching solution of lactic acid or tartaric acid. The process of defining the groove 102 is not limited to such a crystallographic chemical etching process. However, the groove 102 may be defined by an anisotropic oblique etching process such as RIE or the like.

The inner surfaces 102a, 102b of the groove 102 are inclined to underlie the mesas 111, 112 at an inclination equal to or greater than a {111}B face, i.e., at an angle θ of 54.7° or less between the inner surfaces 102a, 102b and the surface of the substrate 9.

Figure 7B:
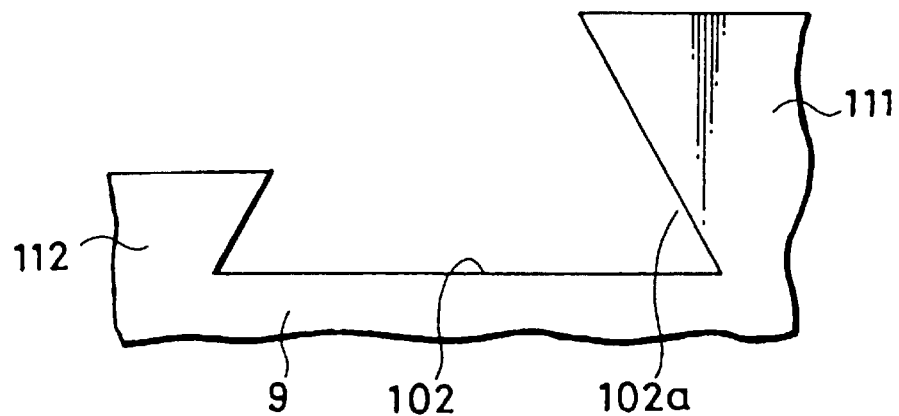
FIG. 7B is a view illustrative of another step of a process of fabricating an optical element according to the present invention.

Then, as shown in FIG. 7B, an etching resist (not shown) is deposited on the first mesa 111, for example, and the other second mesa 112 is etched flatwise to make the second mesa 112 lower than the first mesa 111.

Figure 6:
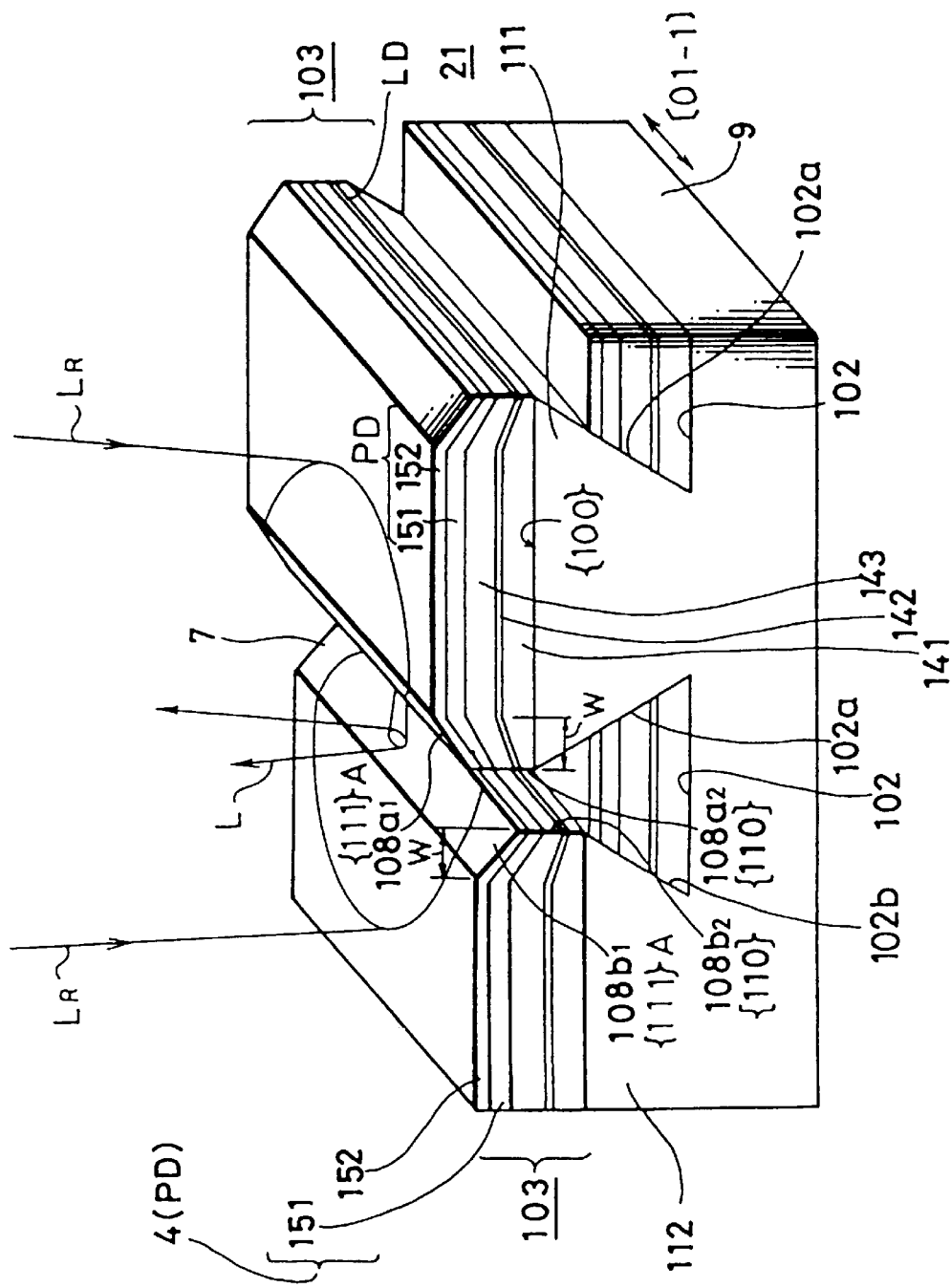
FIG. 6 is a perspective view of an optical element according to the present invention.

Thereafter, as shown in FIG. 6, layers of a semiconductor laser, e.g., a first cladding layer 141 of the first conductivity or "n" type of AlGaAs, for example, an active layer 142 of GaAs or AlGaAs with a lower Al concentration than the first cladding layer 141, a second cladding layer 143 of AlGaAs of a second conductivity or "p" type, a first semiconductor layer 151 of the first conductivity type which will form a photodiode PD as a light-detecting region 4, and a second semiconductor layer 152 of the second conductivity type, are formed in one sequential epitaxy process on the entire surface of the substrate 9 by MOVCD (Metal Organic Chemical Vapor Deposition), for example.

These epitaxial layers can be produced by a methyl MOVCD process which employs material gases of $AsH_3$, TMG (trimethyl gallium), TMA (trimethyl aluminum), etc.

In the above epitaxial process, crystal surfaces $108a_1$, $108b_1$ composed of a {111}A face and then crystal surfaces $108a_2$, $108b_2$ composed of a {110} face are created on the first and second mesas 111, 112 along the edges along the groove 102, i.e., in the [01-1] direction. This is because in a III–V group compound semiconductor, the growth rate of a {100} face is the largest among {100}, {111}A, {110}, and {111}B faces, and the growth rates of the {111}A, {110}, and {111}B faces are successively smaller in the order named. The growth rates of the crystal faces can be established by selecting epitaxial growth conditions, e.g., growth temperatures and the ratio at which materials of III and V groups are supplied.

As described above, the growth rates of the crystal faces are different from each other. Therefore, when the semiconductor layers 141, 142, 143, 151 are epitaxially grown, since the inner surfaces 102a, 102b of the groove 102 have been formed as surfaces inclined at an inclination equal to or greater than the {111}B face in the groove 102, epitaxial growth almost stops progressing from the inner surfaces 102a, 102b but is carried out principally from only the bottom of the groove 102 while the {111}B face of the low growth rate remains at the inner surfaces 102a, 102b or when the {111}B face is produced by epitaxial growth.

Consequently, the layers on the mesas 111, 112 are epitaxially grown independently of others on at least the edges adjacent to the groove 102. The {111}A face which is inclined at an angle of 54.7° to the substrate surface and has a growth rate lower than the {100} face is produced on each of the edges along the [01-1] direction, and each of the semiconductor layers is bent by the {111}A face over a given width W from the edge of the mesa. When the {110} face is produced along the [01-1] direction as the {111}A face grows, the apparent growth of the {110} face does not occur because the growth rate of the {110} face is very low. Therefore, the end surfaces $108a_2$, $108b_2$ each composed of the {110} face are formed, and at the same time, the end surfaces $108a_1$, $108b_1$, each composed of the {111}A face are formed.

In this manner, the semiconductor laser LD composed of at least the first cladding layer 141, the active layer 152, and the second cladding layer 143 is formed on the first mesa 111, and the reflecting mirror 7 composed of the end surface $108b_1$ of the {111}A face which is inclined at 54.7° to the substrate surface is disposed on the second mesa 112. Furthermore, the photodiode PD composed of the first and second semiconductor layers 151, 152 and serving as the light-detecting region 4 is formed on the second mesa 112. If necessary, the first and second semiconductor layers 151, 152 on the semiconductor laser LD on the first mesa 111 may serve as a photodiode PD.

If two grooves 102 are defined at a predetermined spaced interval, i.e., an interval corresponding to the resonator length of the semiconductor laser LD, as shown in FIG. 6, then since end surfaces $108a_2$ of the {110} face are formed on the first mesa 111 respectively adjacent to the inverted-mesa side surfaces 102a of the grooves 102, the semiconductor layer LD has a resonator positioned between the end surfaces $108a_2$ and having end surfaces composed respectively of the end surfaces $108a_2$. The semiconductor layer LD thus constructed as a window structure where the active layer 142 and the first and second cladding layers 141, 143 disposed one on each side of the active layer 142 have a shape bent over the width W along the {111}A face, and semiconductor layers having small refractive indexes are present at the ends of the resonator.

The optical element 21 of the above structure is capable of reflecting light, i.e., a laser beam, emitted from the semiconductor laser LD from the reflecting mirror 7 obliquely above the substrate. Consequently, the optical element 21 can apply the laser beam at a desired incident angle to the irradiated medium 2, e.g., an optical recording medium. The optical element 21 can also allow returning light $L_R$ reflected from the irradiated medium 2 to be applied to and detected by the light-detecting surfaces of the light-detecting regions 4 in the form of the photodiodes PD at a desired angle α.

Figure 8:
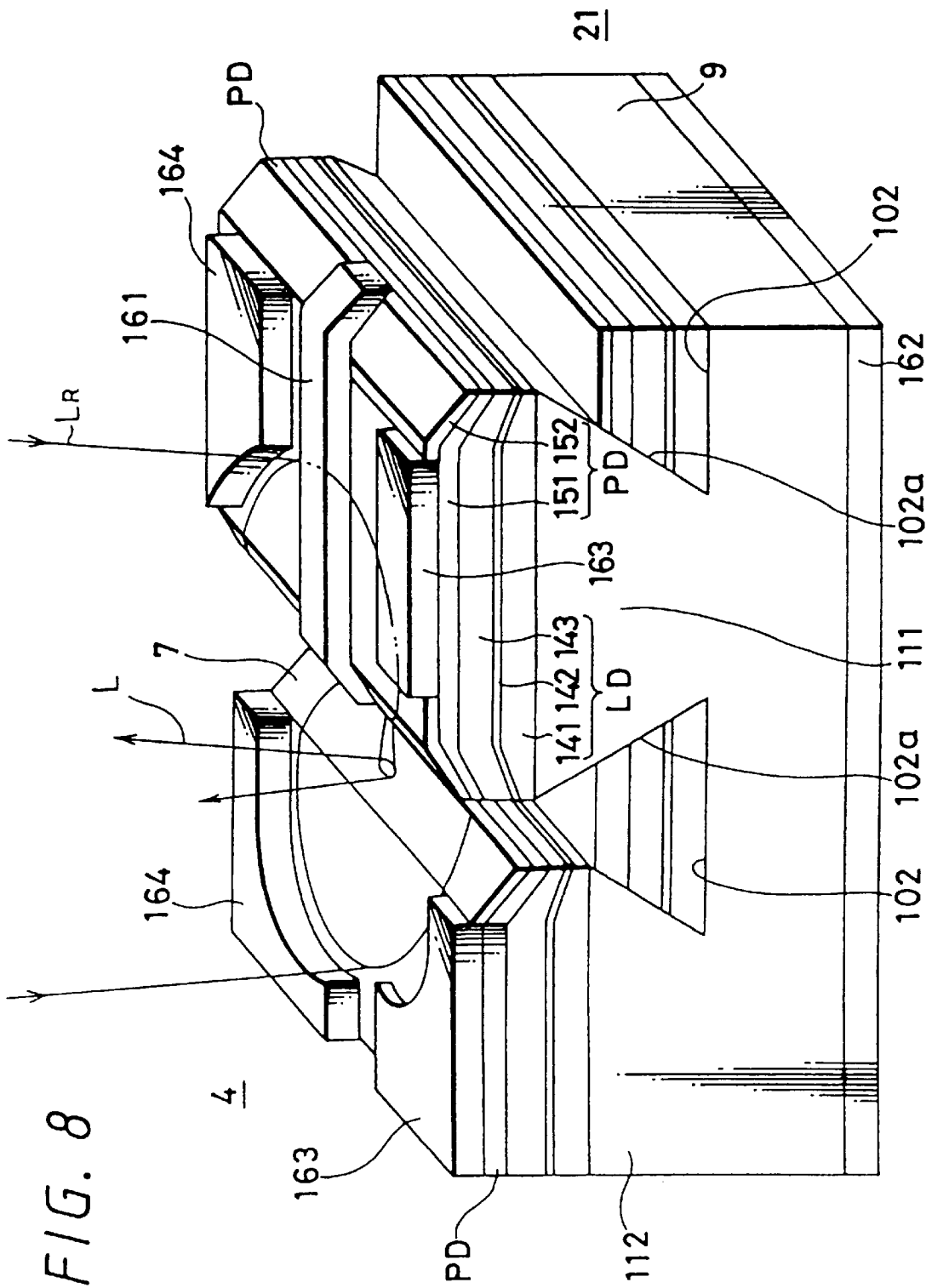
FIG. 8 is a perspective view of an optical element according to the present invention.

In the optical element 21 shown in FIG. 1, electrodes of the semiconductor laser LD and the photodiodes PD may be arranged in any of various layouts. In an embodiment shown in FIG. 8, the first and second semiconductor layers 151, 152 on the first mesa 111 over a portion which constitutes a stripe resonator are etched away in a stripe pattern, and an electrode 161 of the semiconductor laser LD is disposed in ohmic contact with the etched-away region whereas another electrode 162 is disposed in ohmic contact with the reverse side of the substrate 9. Portions of the second conductor layer 152 on the mesas 111, 112 are etched away, exposing the lower first semiconductor layer 151, and electrodes 163 are disposed in ohmic contact with the exposed first semiconductor layer 151 whereas other electrodes 164 are disposed in ohmic contact with the second conductor layer 152.

In the above embodiment, the groove 102 is of an inverted-mesa configuration at the side surfaces 102a, 102b. However, only the side surface 102a of the first mesa 111 on which the semiconductor laser LD is formed may be of an inverted-mesh configuration. Such an alternative arrangement, together with a process of manufacturing the same, will be described below with reference to FIGS. 9A through 9C.

Figure 9A:
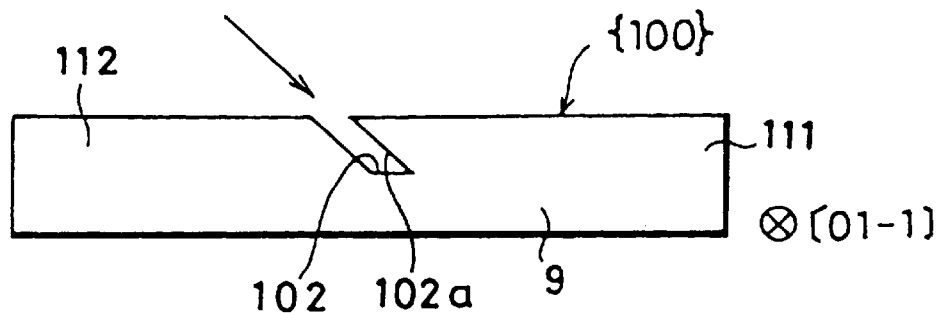
FIG. 9A is a view illustrative of a step of a process of fabricating an optical element according to the present invention.

As shown in FIG. 9A, a compound semiconductor substrate 9 of GaAs having a principal surface composed of a {100} crystal face is prepared, and a stripe groove 102 is defined in the principal surface in the direction of a [01-1] crystal axis by anisotropic dry etching such as RIE or the like. At this time, one side surface 102a of the groove 102 is inclined as a surface composed of a {111}B face or composed nearly of a {111}B face, or a surface inclined at 54.7° or less to the substrate surface.

Figure 9B:
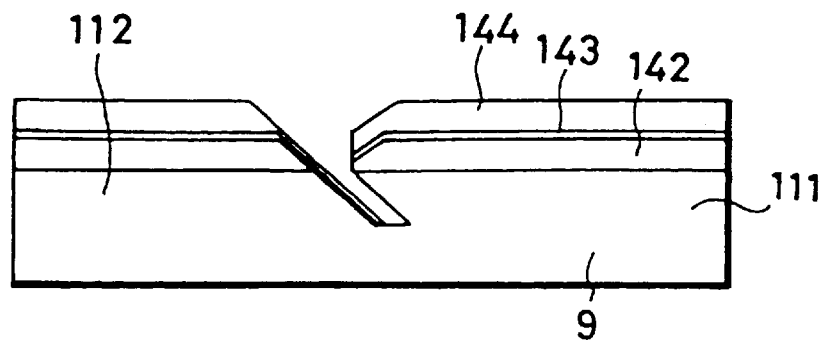
FIG. 9B is a view illustrative of another step of a process of fabricating an optical element according to the present invention.

As shown in FIG. 9B, a first cladding layer 141, an active layer 142, and a second cladding layer 143 of a semiconductor laser LD are then epitaxially grown.

Figure 9C:
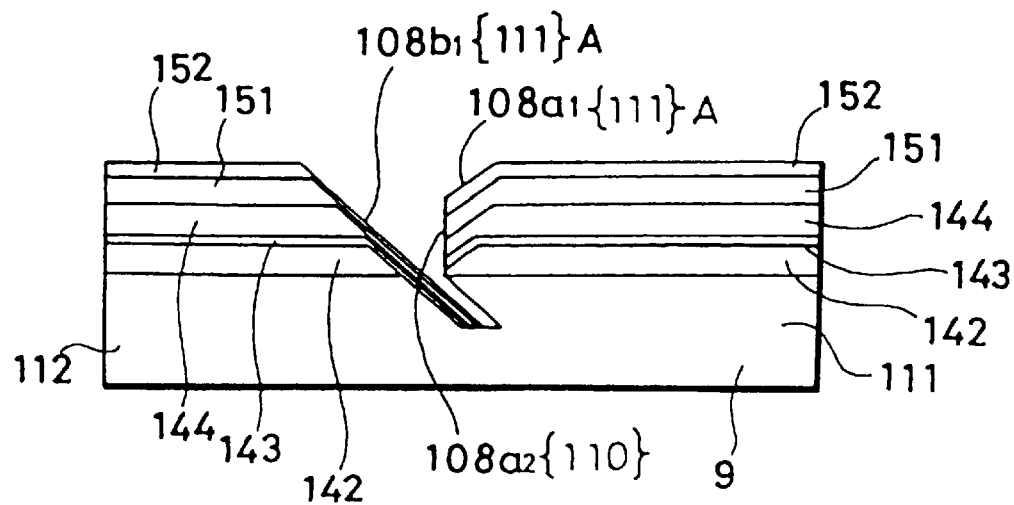
FIG. 9C is a view illustrative of another step of still another process of fabricating an optical element according to the present invention.

As shown in FIG. 9C, first and second semiconductor layers 151, 152 are then epitaxially grown. An end surface $108a_1$, composed of a {111}A face and an end surface $108a_2$ composed of a {110}A face are produced on the epitaxial semiconductor layer on a first mesa adjacent to an inverted-mesa side surface 102a of the groove 102, and only an end surface $108b_1$ composed of a {111}A face is primarily produced on a side surface 102b of the groove 102. Mesas 111, 112 can be formed to the same height, i.e., have upper surfaces lying flush with each other. Although not shown, a metal or dielectric single-layer or multiple-layer may be formed on the end surface 108b, by oblique evaporation or sputtering for increasing its reflecting efficiency, and if a conductive film such as a metal film or the like is deposited as a reflecting film on the end surface $108b_1$, then electrodes of photodiodes and the semiconductor laser may be formed on the mesas 111, 112 at the same time that the reflecting film is formed by oblique evaporation or sputtering.

In each of the above embodiments, the semiconductor laser is of a basic structure composed of a first cladding layer, an active layer, and a second cladding layer. However, the semiconductor laser may be of any various structures, e.g., may include a cap layer.

A process of manufacturing an optical element 21 according to the present invention where a light-emitting region 1 and a light-detecting region 4 are integrally disposed on a common substrate 9 in a monolithic structure will be described below with reference to FIGS. 10A through 10C. In this embodiment, a light-emitting region is formed only on a reflecting mirror.

Figure 10A:
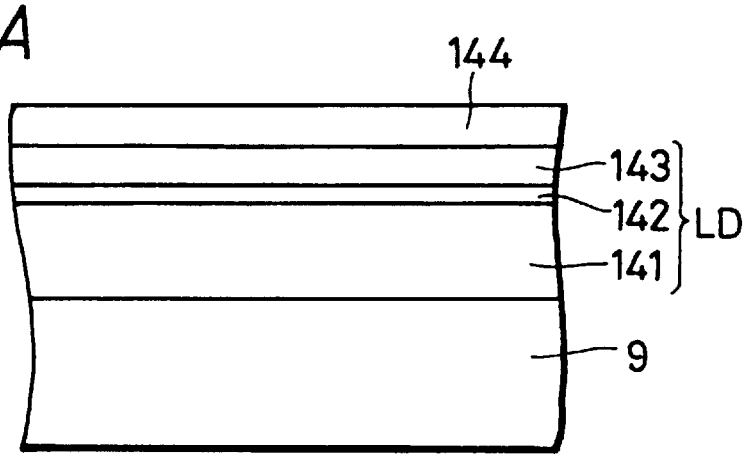
FIG. 10A is a view illustrative of a step of a process of fabricating an optical element according to the present invention.

As shown in FIG. 10A, layers of a semiconductor laser LD, e.g., a first cladding layer 141 of the conductivity type which is the same as the substrate 9, e.g., "n" type, of AlGaAs, for example, an active layer 142 of GaAs or AlGaAs with a lower Al concentration than the first cladding layer 141, a second cladding layer 143 of "p" type having the same composition as the first cladding layer 141, and a cap layer 144 of GaAs, for example, are epitaxially grown on the entire surface of a compound semiconductor substrate 9 as of GaAs, InP, or the like with a {100} crystal face as a principal surface, by MOVCD, for example.

These epitaxial layers can be produced by a methyl MOVCD process which employs material gases of $AsH_3$, TMG (trimethyl gallium), TMA (trimethyl aluminum), etc.

Figure 10B:
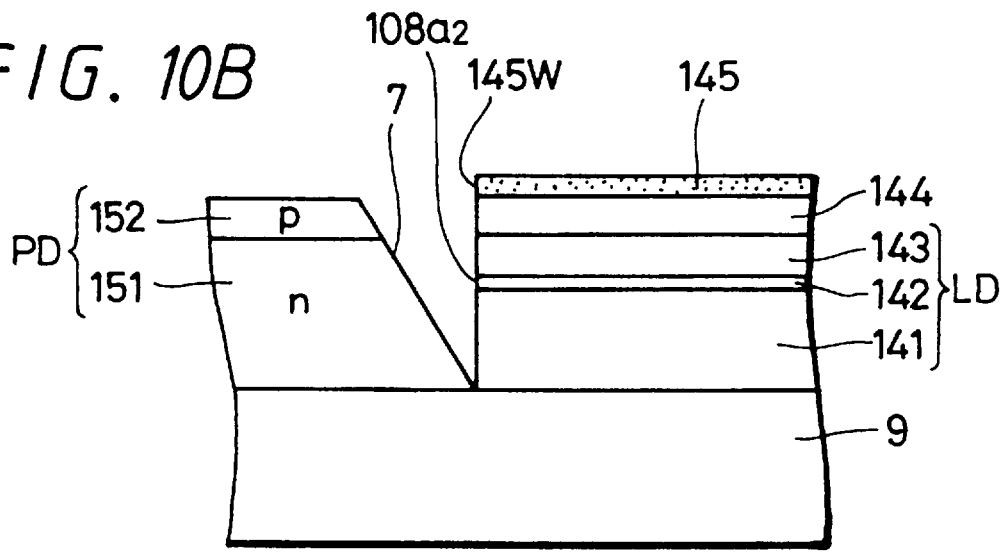
FIG. 10B is a view illustrative of another step of a process of fabricating an optical element according to the present invention.

Then, as shown in FIG. 10B, an insulating layer 145 for use as a mask in selective etching and epitaxy, which has an opening 145W is formed by photolithography on a portion of the cap layer 144 where a reflecting mirror and a light-emitting region will finally be formed. The cap layer 44 which is exposed through the opening 145W, the second cladding layer 143, the active layer 142, and the first cladding layer 141 below the cap layer 144 are then selectively etched by anisotropic etching such as RIE (reactive ion etching) which exhibits etching capability perpendicular to the substrate surface, thereby forming an end surface $108a_2$ serving as an end surface of the resonator of the semiconductor laser LD. Then, a reflecting mirror 7 is formed in confronting relationship to the resonator end surface $108a_2$. The reflecting mirror 7 is composed of a crystal face produced of its own accord by epitaxial growth of an "n"-type first semiconductor layer 151 of GaAs, for example, by MOCVD on the substrate 9 which is exposed through the opening 145W of the insulating layer 145 used as the selective epitaxy mask. Specifically, if the resonator end surface $108a_2$ is composed of {01-1} crystal face, then the reflecting mirror 7 is composed of a {111}B face and inclined at 54.7° to the substrate surface. Then, as shown in FIG. 10B, a "p"-type second semiconductor layer 152 of GaAs is formed on the semiconductor layer 151, forming a pn junction which serves as a photodiode PD.

Figure 10C:
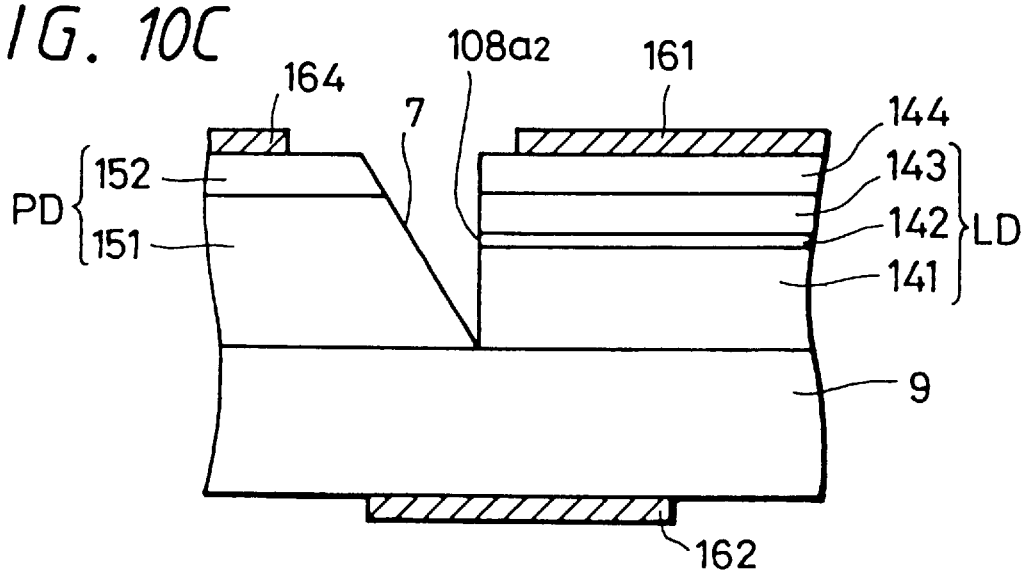
FIG. 10C is a view illustrative of another step of still another process of fabricating an optical element according to the present invention.

Thereafter, as shown in FIG. 10C, the insulating layer 145 is removed, and electrodes 161, 162, 164 are deposited in ohmic contact with the cap layer 144, the reverse side of the substrate 9, and the semiconductor layer 152, respectively. If the resonator end surface is composed of a {01-1} crystal face, as described above, then the electrode 161 on the cap layer 144, which will serve as an electrode of the semiconductor laser, is formed as a stripe in the [01-1] direction.

In the above process of manufacturing an optical element, the pn junction, i.e., the second semiconductor layer 152, is formed by epitaxial growth. However, the second semiconductor layer 152 may be formed by diffusion or ion implantation.

In the above embodiments, the substrate whose principal surface is composed of a {100} crystal face is employed. However, if a substrate whose principal surface is not a {100} crystal face is employed, then it is possible to freely vary the angle at which the reflecting mirror 7 is inclined, i.e., an incident angle $\alpha$ at which returning light is applied to the light-detecting region 4.

In the above embodiments, one optical element 21 is formed on a common substrate 9. However, at least three optical elements 211, 212, 213 may be disposed on a common substrate 9 as shown in FIG. 3. In such an arrangement, a light-emitting region 1 and light-detecting regions 4 of each of the optical elements 211, 212, 213 on the common substrate 9 are disposed closely to each other. As shown in FIG. 3, the first and third optical elements 211, 213 are disposed substantially symmetrically one on each side of the second optical element 212.

Figure 11:
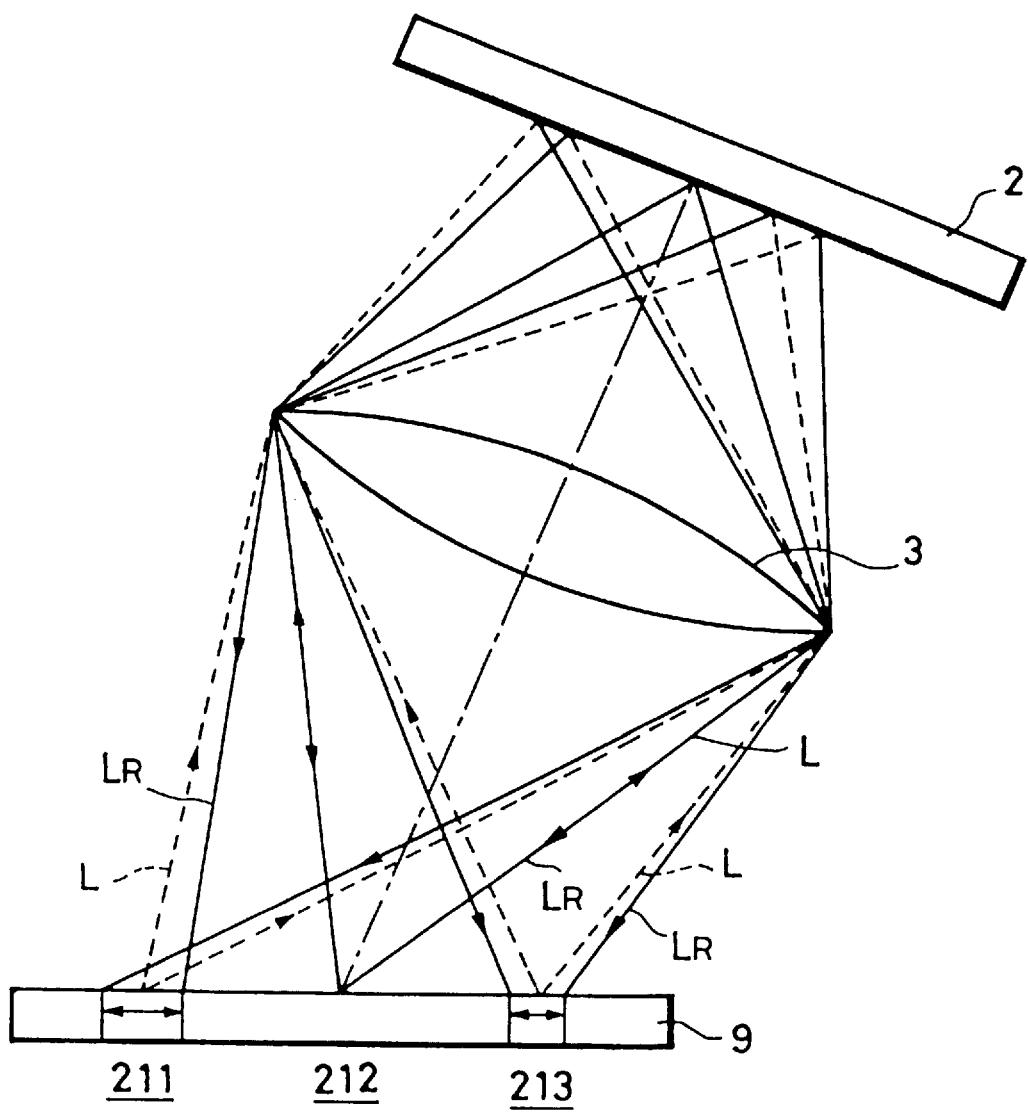
FIG. 11 is a view showing optical paths in an optical device according to the present invention.
Figure 12:
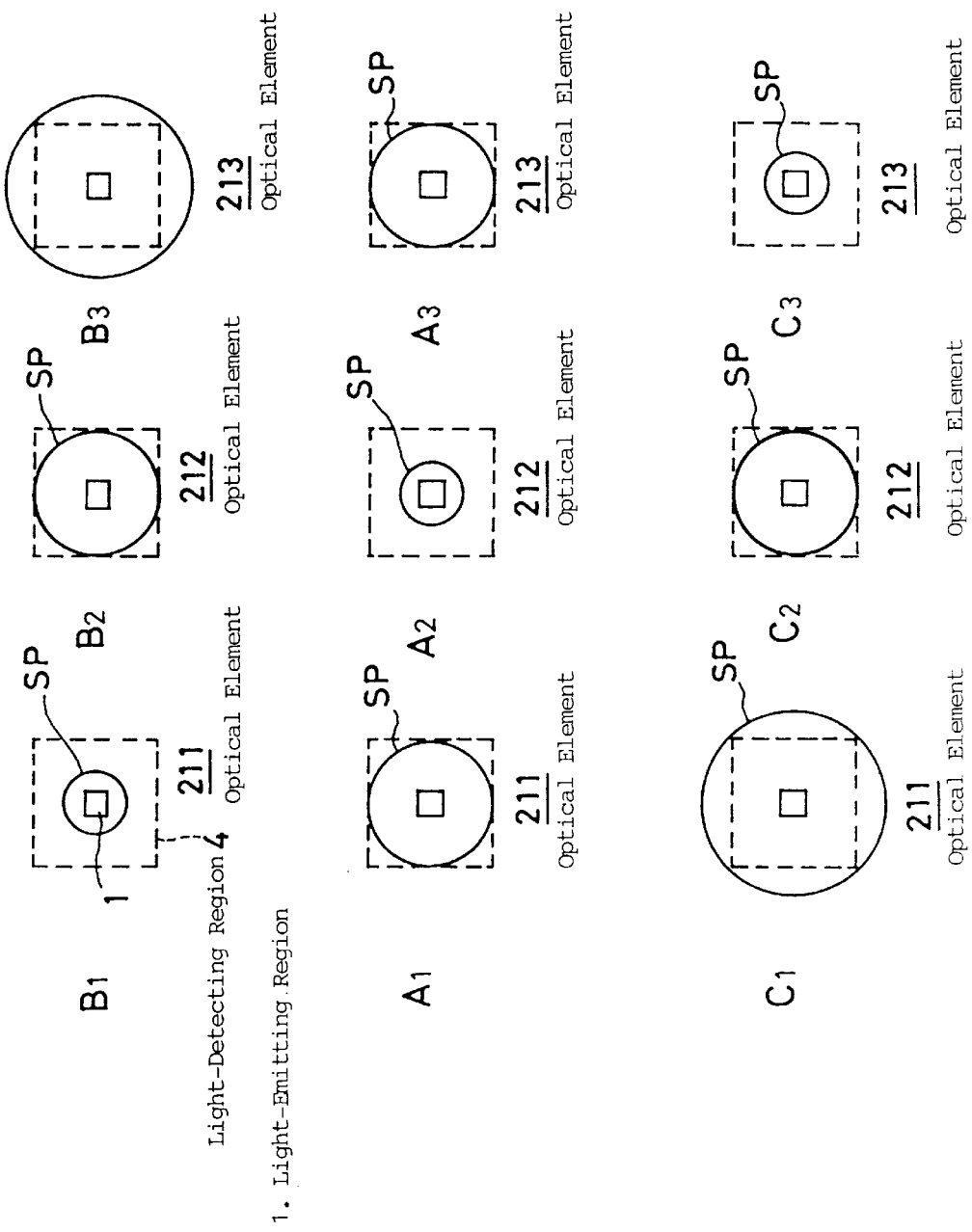

FIG. 11 schematically shows optical paths of light emitted from and returning to the optical elements 211, 212, 213. As shown in FIG. 11, light L emitted from the first, second, and third optical elements 211, 212, 213 is converged by a converging means 3 and applied to an irradiated medium 2 obliquely, rather than perpendicularly, thereto, in the same manner as described above with reference to FIG. 1.

Returning light $L_R$ reflected from the irradiated medium 2 is converted nearly to a diffraction limit by the converging means 3, and applied to the light-detecting regions 4 of the optical elements 211, 212, 213 which are positioned in the vicinity of a confocal point of the converging means 3.

The light L emitted from the respective light-emitting regions 1 of the optical elements 211, 212, 213 and the returning light $L_R$ travel along optical paths different between the optical elements 211, 212, 213. The emitted light L is converged by the converging means 3 and applied to the irradiated medium 2, and the returning light $L_r$ reflected by the irradiated medium 2 is converged by the converging means 3 and applied to the light-detecting regions 4 of the optical elements 211, 212, 213.

The light L emitted from the optical elements 211, 212, 213 is obliquely applied to the irradiated medium 2 such that the returning light L is applied to the light-detecting surfaces of the light-detecting regions 4 of the optical elements 211, 212, 213 at an incident angle $\alpha$ in the range of $0°<\alpha<90°$.

An optical device which employs the three optical elements 211, 212, 213 thus arranged is capable of detecting a range based on the differential range-finding, e.g., detecting focusing for focusing servo control. Specifically, as shown in FIG. 11, a focused condition of the central optical element 212 with respect to the irradiated medium 2 is detected based on the difference between detected intensities of light detected by the first and third optical elements 211, 213, i.e., the difference between output signals from the photodiodes PD of the light-detecting regions 4 of the first and third optical elements 211, 213. Such a focus detecting process will be described below with reference to FIGS. $12A_1$~$12A_3$, $12B_1$~$12B_3$, and $12C_1$~$12C_3$.

In each of FIGS. $12A_1$~$12A_3$, $12B_1$~$12B_3$, and $12C_1$~$12C_3$, the solid-line circle represents a spot of returning light applied to an optical element, the solid-line square an effective insensitive zone of a light-emitting region 1, and the broken-line square an effective light-detecting zone of a light-detecting region 4. In FIG. $12A_2$, the light emitted from the central optical element 212 is focused on the irradiated medium 2. The first and third optical elements 211, 213 are arranged such that when the light emitted from the central optical element 212 is focused on the irradiated medium 2, the areas of the first and third optical elements 211, 213 which detect returning light are equal to other as shown in FIGS. $12A_1$, $12A_3$, i.e., the intensities of light detected by the first and third optical elements 211, 213, i.e., detected output signals therefrom, are equal to each other.

When the light emitted from the central optical element 212 is underfocused or overfocused on the irradiated medium 2 as shown in FIG. $12B_2$ or $12C_2$, as the spot of the returning light on the effective light-detecting zone of one of the optical elements 211, 213 is smaller, the spot of the returning light on the effective light-detecting zone of the other of the optical elements 211, 213 is greater, and vice versa. Therefore, the levels of the detected output signals from the light-detecting regions of the optical elements 211, 213 vary in inverse relationship to each other. When the difference between the detected output signals from the light-detecting regions of the optical elements 211, 213 is detected, accordingly, the focused condition of emitted light on the central optical element 212 can be detected, and the detected output signals may be used as a focus servo signal. As shown in FIG. 13, a servo signal output Ps based on the difference between the detected output signals from the optical elements 211, 213 is related to a focused position Df.

With the optical element 21 according to the present invention, as described above, the light-emitting region 1 and the light-detecting region 4 are disposed on the common substrate 9 with the distance therebetween being sufficiently small, e.g., of about several $\mu$m. Therefore, the light-detecting region 4 can detect returning light with increased efficiency. The relative positional relationship between the light-emitting region 1 and the light-detecting region 4 can be established accurately and reliably on a mass-production basis.

Since the returning light is obliquely applied to the light-detecting region 4, the effective insensitive zone thereof may be small for higher efficiency with which the returning light is detected.

Inasmuch as the light-emitting region 1 and the light-detecting region 4 are disposed on the common substrate 9, they can be positioned highly closely to each other. Consequently, as shown in FIG. 2, the light travels along coaxial optical paths along the same optical axis indicated by the chain line "a" before and after the light is applied to the irradiated medium 2, and the final returning light traveling toward the light-emitting region 1 is directly detected by the light-detecting regions 2 at substantially the same confocal point as the light-emitting region 1, allowing the light-detecting regions 2 to detect light highly efficiently.

According to the present invention, in the optical element 21 (211, 212, 213), the returning light $L_R$ is applied to the light-detecting surfaces of the light-detecting regions 4 at an incident angle $\alpha$ in the range of $0°<\alpha<90°$. This arrangement increases the effective light-detecting zone of the light-detecting regions for detecting the returning light. If the returning light $L_R$ were applied perpendicularly to the light-detecting surfaces of the light-detecting regions 4 as shown in FIG. 14, i.e., if the light L were perpendicularly emitted from the light-emitting region 1 along the same optical axis "a" as the returning light, there would be created an effective insensitive zone having a width $W_1$ where it cannot detect the returning light, because of the existence of the light-emitting region 1 or an area in which the light is emitted therefrom, or the existence of a reflecting mirror used to emit the light in a given direction.

With the arrangement shown in FIG. 1 according to the present invention, however, since the returning light is obliquely applied, an effective insensitive zone has a width $W_2$ expressed as $W_1 \cos\alpha$, i.e., $W_2 < W_1$, and is reduced. As a result, the light-detecting area of the light-detecting regions 4 is increased.

According to the present invention, as described above, the light-emitting region 1 and the light-detecting region 4 for detecting returning light are integrally combined with each other. If the optical element according to the present invention is incorporated in an optical pickup for use with an optical recording medium such as an optical disk, a magnetooptical disk, or the like, then the optical pickup may be simplified in arrangement, reduced in overall size, and manufactured in a simplified process, and may have increased reliability.

In as much as the effective insensitive zone produced by the light-emitting region 1 is reduced because the light-emitting region 1 and the light-detecting region 4 are positioned closely to each other and the returning light is obliquely applied to the light-detecting region 4, the efficiency with which the returning light is detected is increased. Therefore, the intensity of the emitted light may be reduced, resulting in a reduced power requirement, and the level of a detected output signal may be increased for an increased S/N ratio.

The use of a plurality of optical elements, as described above, is effective in achieving focusing servo control.

If the reflecting surface of the reflecting mirror is composed of a certain crystal face, then the optical device is made highly efficient as the reflecting surface can be formed as a highly excellent optical surface lying at a desired angle.

We claim:

1. An optical device comprising:

an optical element having a light-emitting region, light-detecting regions, a reflection mirror and a common substrate in which said light-emitting region and said light-detecting regions and said reflection mirror are formed, wherein said light-detecting regions comprise photo-diodes positioned on opposite sides of said reflection mirror on a top side of said common substrate and at least a portion of each of said photo-diodes is disposed within a diffraction limit of said returning light from said light-emitting region, wherein said light emitting region comprises a laser diode positioned in said substrate beneath one of said photo-diodes;

wherein said diffraction limit is $1.22\lambda/NA$, where $\lambda$ is the wavelength of the light emitted from the light-emitting region and NA is the numerical aperture of a lens interposed in the path of light from said light-emitting region to said light-detecting regions, and wherein said reflection mirror and said light-detecting regions are arranged such that the returning light is applied to said light-detecting region at an incident angle $\alpha$ in the range of $0° < \alpha 90°$.

2. An optical device according to claim 1, wherein said reflecting mirror has a reflecting mirror composed of a {111} crystal face.

3. An optical device according to claim 1, wherein said semiconductor laser is disposed on a semiconductor substrate which has a principal surface composed of a {100} face.

4. An optical device comprising:

at least first, second, and third optical elements and a reflection mirror disposed on a common substrate, each of said optical elements having a light-emitting region and light-detecting regions;

said first and third optical elements being substantially symmetrically positioned on each side of said second optical element; and converging means for converging and applying light emitted by the light-emitting regions of the first, second, and third optical elements and causing said light to travel through different optical paths, to an irradiated medium, and converging returning light from the irradiating medium;

said light-detecting regions of each of the first, second, and third optical elements being disposed in the vicinity of a confocal point of said converging means with respect to the returning light reflected by the irradiated medium and on opposite sides of said reflection mirror;

said light detecting regions being positioned on an upper surface of said substrate;

said light emitters comprising lasers positioned within said substrate beneath said light detecting regions;

the arrangement being such that the returning light is applied to a light-detecting surface of each of the light-detecting regions at an incident angle $\alpha$ in the range of $0° < \alpha < 90°$, at least a part of each of said light-detecting regions being disposed within a diffraction limit of the returning light from said light-emitting region;

wherein said diffraction limit is $1.22\lambda/NA$ where $\lambda$ is the wavelength of the light emitted from the light-emitting region and NA is the numerical aperture of a lens interposed in the path of light from said light-emitting region to said light-detecting region.

* * * * *